United States Patent
Brioschi et al.

(10) Patent No.: US 12,428,292 B2
(45) Date of Patent: Sep. 30, 2025

(54) WATERPROOF MEMS PRESSURE SENSOR PACKAGE WITH A METAL LID AND AN EMBEDDED ePTFE FILTER AND PROCESS OF MAKING

(71) Applicant: InvenSense, Inc., San Jose, CA (US)

(72) Inventors: Roberto Brioschi, Austin, TX (US); Vijay Wakharkar, Los Gatos, CA (US); Monisha Sharma, Los Gatos, CA (US)

(73) Assignee: InvenSense, Inc., San Jose, CA (US)

( * ) Notice: Subject to any disclaimer, the term of this patent is extended or adjusted under 35 U.S.C. 154(b) by 606 days.

(21) Appl. No.: 17/733,720

(22) Filed: Apr. 29, 2022

(65) Prior Publication Data

US 2023/0087021 A1    Mar. 23, 2023

Related U.S. Application Data

(60) Provisional application No. 63/245,715, filed on Sep. 17, 2021.

(51) Int. Cl.
| | |
|---|---|
| *B81B 7/00* | (2006.01) |
| *B81C 1/00* | (2006.01) |
| *G01L 19/06* | (2006.01) |

(52) U.S. Cl.
CPC .......... *B81B 7/0038* (2013.01); *B81B 7/0058* (2013.01); *B81C 1/00285* (2013.01); *G01L 19/0645* (2013.01); *B81B 2201/0264* (2013.01)

(58) Field of Classification Search
CPC .......... B81B 7/0038; B81B 2201/0264; B81B 7/0058; B81C 1/00285; G01L 19/0645
See application file for complete search history.

(56) References Cited

U.S. PATENT DOCUMENTS

| | | | |
|---|---|---|---|
| 9,965,000 B2 * | 5/2018 | Koppal | H05K 3/303 |
| 11,117,798 B2 * | 9/2021 | Lorenz | H04R 1/023 |

(Continued)

FOREIGN PATENT DOCUMENTS

| | | |
|---|---|---|
| CN | 201491214 U | 5/2010 |
| CN | 208676373 U | 4/2019 |

(Continued)

OTHER PUBLICATIONS

International Search Report and Written Opinion in International Application No. PCT/US2022/041427, mailed Dec. 6, 2022.

(Continued)

*Primary Examiner* — Jeff W Natalini
*Assistant Examiner* — Brandon C Fox
(74) *Attorney, Agent, or Firm* — DLA Piper LLP (US)

(57) ABSTRACT

Microelectromechanical system (MEMS) packages and methods of making thereof. A MEMS package includes at least one MEMS device disposed on a base substrate and a lid disposed on the base substrate. The lid is configured to enclose the at least one MEMS device. The lid includes a body portion configured to be coupled to the base substrate, a ceiling portion and a membrane. The ceiling portion, the body portion and the ceiling portion form a cavity in which the at least one MEMS device is enclosed. The membrane is configured to be in contact with the ceiling portion. The membrane is formed from a filtering fabric and is configured to substantially block one or more of liquids and contaminants from passing into the cavity.

27 Claims, 12 Drawing Sheets

(56) References Cited

U.S. PATENT DOCUMENTS

| | | | |
|---|---|---|---|
| 2005/0184003 A1 | 8/2005 | Rodgers et al. | |
| 2010/0175242 A1 | 7/2010 | Wu | |
| 2010/0257938 A1 | 10/2010 | Kurtz et al. | |
| 2017/0089795 A1* | 3/2017 | Perkins | G01L 19/0672 |
| 2018/0070162 A1* | 3/2018 | Lim | H01L 23/043 |
| 2020/0329289 A1* | 10/2020 | Kenaley | H04R 1/02 |

FOREIGN PATENT DOCUMENTS

| | | | | |
|---|---|---|---|---|
| CN | 211576454 U | * | 9/2020 | G01L 19/00 |
| CN | 213455825 U | | 6/2021 | |
| CN | 213834528 U | * | 7/2021 | |
| EP | 3 590 363 A1 | | 1/2020 | |
| WO | 2021/114427 A1 | | 6/2021 | |

OTHER PUBLICATIONS

Search Report in Taiwan Patent Application No. 111133807, completion of search dated Sep. 11, 2023.

\* cited by examiner

WATERPROOF MEMS PRESSURE SENSOR PACKAGE WITH A METAL LID AND AN EMBEDDED ePTFE FILTER AND PROCESS OF MAKING

CROSS REFERENCE TO RELATED APPLICATIONS

This application claims priority to U.S. Provisional Application No. 63/245,715, filed on Sep. 17, 2021, the entire contents of which is incorporated herein by reference.

FIELD

The present disclosure generally related to microelectromechanical system (MEMS) sensors which may be used in many types of devices, including wearable devices, and may be fabricated for many types of applications, including as a pressure sensor package. In particular, the present disclosure relates to MEMS device packages that protect MEMS sensors from the environment, and methods of making.

BACKGROUND

MEMS devices may include specialized packages that may depend, for example upon the type of device and/or application. For example, MEMS devices such as pressure sensors may include a package to accommodate one or more pressure ports, so that a membrane of the pressure sensor may be exposed to an ambient (external) environment. However, other elements of the package, such as an integrated circuit, electrical connectors, bond pads, etc. may need protection from the external environment (e.g., from water and/or other containments).

In conventional solutions, a waterproof MEMS package is typically provided. In some conventional solutions, waterproofing (and environmental protection) is provided by covering the MEMS device with a gel package. The presence of the gel (e.g., on a membrane of a pressure sensor), however, may affect the sensitivity performances of the device and/or may impact the handling of (gel filled) parts. Thus, conventional waterproof MEMS packages with a gel would limit maximizing device product performance.

Accordingly, there is a need for MEMS device packages with improved environmental protection.

SUMMARY

Aspects of the present disclosure relates to a MEMS pressure sensor package that provides improved waterproofing and contamination protection, and a method of making such a package.

In some embodiments a MEMS sensor package is provided that protects MEMS pressure sensor membranes from liquids and/or contaminants which may damage the sensor and affect its performance.

In some embodiments, a microelectromechanical system (MEMS) package is disclosed, comprising: at least one MEMS devices disposed on a base substrate; and a lid disposed on the base substrate, the lid configured to enclose the at least one MEMS device. In some embodiments, the lid comprises a body portion configured to be coupled to the base substrate, a ceiling portion, and a membrane configured to be in contact with the ceiling portion. In some embodiments, the body portion and the ceiling portion form a cavity in which the at least one MEMS device is enclosed. In some embodiments, the membrane is formed from a filtering fabric. The membrane is configured to substantially block one or more of liquids and contaminants from passing into the cavity.

In some embodiments, the ceiling portion comprises a ceiling layer, and the membrane is configured to be adhered to the ceiling layer. In other embodiments, the ceiling portion comprises first and second ceiling layers, the membrane is configured to be embedded between the first and second ceiling layers, and the ceiling portion is configured to be coupled to the body portion. In some embodiments, the body portion and the ceiling portion are formed as a monolithic structure.

In some embodiments, the MEMS package may further include at least one of a hydrophobic coating and an oleophobic coating disposed on the filtering fabric. In some embodiments, the ceiling portion may include one or more holes. Additionally, the membrane may be configured to cover the one or more holes of the ceiling portion.

In some embodiments, the filtering fabric may comprise an expanded polytetrafluoroethylene (ePTFE) material. In some embodiments the lid may be formed from a conductive material comprising a metal. Additionally, the metal may comprise one or more of stainless steel, plated brass, plated aluminum and nickel. In some embodiments, the at least one MEMS device comprises at least one MEMS pressure sensor. In some embodiments, the membrane is configured to provide at least one of waterproofing and contamination protection of the at least one MEMS device. In some embodiments, the body portion may comprise an annular ring and the ceiling portion may comprise a disk shape.

In another aspect, a method of making a MEMS package is disclosed. In one embodiment, a method of making a microelectromechanical system (MEMS) package is provided, comprising: forming a lid comprising a body portion and a ceiling portion such that the body portion and the ceiling portion form a cavity in which at least one MEMS device is configured to be enclosed; forming a membrane from a filtering fabric; disposing the membrane on the ceiling portion such that the membrane is in contact with the ceiling portion, the membrane configured to substantially block one or more of liquids and contaminants from passing into the cavity; and disposing the lid on the base substrate such that the body portion of the lid is coupled to the base substrate, the base substrate including the at least one MEMS device disposed thereon.

In some embodiments, the forming of the lid further comprises forming the body portion and the ceiling portion as a monolithic structure and adhering the membrane to the ceiling portion.

In other embodiments, the forming of the lid further comprises providing first and second ceiling layers, the first and second ceiling layers forming the ceiling portion; and coupling the ceiling portion to the body portion, where the disposing of the membrane further comprises embedding the membrane between the first and second ceiling layers. Additionally, in some embodiments, the first and second ceiling layers may be adhered together without adhering the membrane to the first and second ceiling layers. Additionally, in other embodiments, the membrane may be adhered to one or more of the first and second ceiling layers.

In some embodiments, the method may further comprise disposing at least one of a hydrophobic coating and an oleophobic coating on the filtering fabric. In some embodiments, the method may further comprise forming one or more holes in the ceiling portion, where the membrane is configured to cover the one or more holes of the ceiling portion. In some embodiments, the filtering fabric may comprise an ePTFE material.

In some embodiments, the lid may be formed from a material comprising one or more of a metal and a polymer. Additionally, the metal may comprise one or more of stainless steel, plated brass, plated aluminum and nickel.

In another aspect, a method of manufacturing a plurality of housing packages is disclosed. In one embodiment, a method of manufacturing a plurality of housing packages, where each housing package is configured to enclose a microelectromechanical system (MEMS) device is provided, comprising: providing a first ceiling layer having a matrix of first ceiling components, each of said first ceiling components having one or more first holes arranged in a first pattern; providing a second ceiling layer having matrix of second ceiling components, each of said second ceiling components having one or more second holes arranged in the first pattern; providing a membrane layer comprising a filtering fabric; embedding the membrane layer between the first ceiling layer and the second ceiling layer such that the matrix of first ceiling components align with the matrix of second ceiling components, to form a third ceiling layer; separating the third ceiling layer to form a plurality of ceiling portions corresponding to the plurality of housing packages; and coupling the plurality of ceiling portions to a plurality of base portions to form the plurality of housing packages.

In some embodiments, the embedding of the membrane further comprises adhering the membrane layer to each of the first ceiling layer and the second ceiling layer. In other embodiments, the embedding of the membrane further comprises: forming one or more third holes in the membrane arranged in a second pattern, the second pattern being different form the first pattern; disposing an adhesive agent on one of the first ceiling layer and the second ceiling layer in accordance with the second pattern; and adhering the first ceiling layer to the second ceiling layer in accordance with the adhesive agent via the one or more third holes of the membrane.

In some embodiments, the filtering fabric comprises an ePTFE material. In some embodiments, the first ceiling layer, the second layer and the plurality of base portions are each formed from a metal material comprising one or more of stainless steel, plated brass, plated aluminum and nickel. In some embodiments, the method further comprises disposing at least one of a hydrophobic coating and an oleophobic coating on at least a portion of the filtering fabric.

BRIEF DESCRIPTION OF THE DRAWINGS

Examples of the MEMS device package (referred to as a MEMS package herein) and a method of forming the MEMS package are shown in the accompanying drawings.

DETAILED DESCRIPTION

As mentioned above, it is desirable to form MEMS devices (e.g., MEMS sensors) so that they may be protected from the environment. For example, it may be desirable to protect a MEMS pressure sensor membrane from liquids and/or contaminants which may damage the sensor and affect its performance. Accordingly, providing robust techniques and methods for waterproofing capabilities to a pressure sensor package are important.

Figure 1:
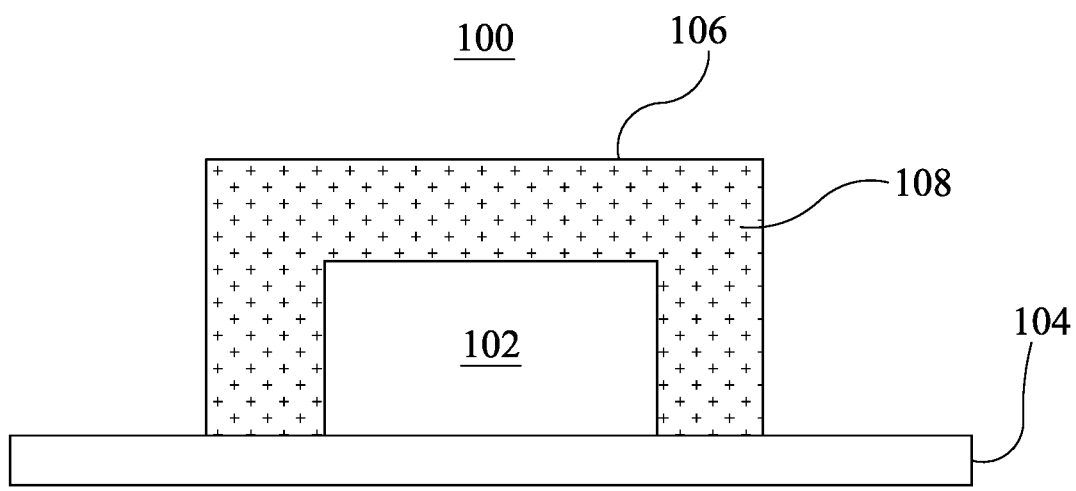
FIG. 1 is a cross-sectional view diagram of a prior art MEMS sensor package.

Referring to FIG. 1, a cross-sectional view diagram of prior art MEMS sensor package 100 (referred to herein as conventional package 100) is shown. In general, conventional package 100 may include MEMS sensor 102 disposed on base substrate 104. MEMS sensor 102 may be enclosed by lid 106 that is coupled to base substrate 104. In some examples, lid 106 may include one or more holes (not shown) that may form port(s) to an external environment. Conventional package 100 may be filled with gel 108, in order to provide waterproofing of elements within package 100. Gel 108 is typically disposed in a manner to cover MEMS sensor 102 (as well as any other components (not shown), such as any integrated circuits, bond pads, bond wires, connectors and the like. In general, gel 108 may include a gelatinous compound and represents an example of a potting material that may be used to encapsulate electronic components. In a non-limiting example, gel 108 may include a potting gel manufactured by Shin-Etsu, such as SIFEL® 8470.

In conventional package 100, gel 108 (typically) fully covers an exposed surface of MEMS sensor 102. However, because gel 108 covers a surface of MEMS sensor 102 that is to be exposed to the external environment (e.g., a membrane of a pressure sensor), gel 108 may affect the sensitivity performance of MEMS sensor 102, (e.g., the gravity (g)-sensitivity of the pressure sensitivity). For example, gel 108 introduces an additional pressure force on the membrane of MEMS sensor 102 (e.g., due in part to the thickness and density of gel 108 on the membrane and a density of gel 108), thereby reducing the ability of the membrane to react to changes in pressure. This additional pressure force may thus reduce the g-sensitivity of the membrane, and cause a delayed reaction time by MEMS sensor 102 (e.g., when MEMS sensor 102 is upside down). Thus, gel 108 may negatively impact the performance of MEMS sensor 102. In addition, users may have concerns with respect to handling gel-filled components of conventional package 100 (e.g., due to the texture of gel 108 and/or any other concerns). For examples, a surface of gel 108 may pick up dust and/or contaminants from the environment and/or during usage. Such a change in appearance over time may give rise to concerns with a quality (e.g., performance, durability, etc.) of MEMS sensor 102 and/or package 100 itself.

Aspects of the present disclosure relate to MEMS packages and methods of making thereof. In some examples, a MEMS package may include at least one MEMS device disposed on a base substrate and a lid disposed on the base substrate. The lid may be configured to enclose the MEMS device(s). In some embodiments, the lid may include a body portion configured to be coupled to the base substrate, a ceiling portion, and a membrane configured to be in contact with the ceiling portion. In some embodiments, the body portion and the ceiling portion may form a cavity in which the MEMS device(s) may be enclosed. In some embodiments, the membrane may be formed from a filtering fabric. The membrane may be configured to substantially block one or more of liquids and contaminants from passing into the cavity. In some embodiments, the filtering fabric may be formed from an ePTFE material (also referred to herein as an ePTFE membrane). In some embodiments, the MEMS device(s) may include a MEMS pressure sensor. In some embodiments, the MEMS package may include one or more holes in the ceiling portion (e.g., to form one or ports to an external environment). The filtering fabric may provide waterproofing and/or contamination protection of the MEMS device(s), by covering the hole(s) to prevent entrance of fluids and/or other containments, while still allowing for exposure of the MEMS sensor to the external environment.

In some embodiments of the present disclosure, the ceiling portion may include at least one ceiling layer in contact with the membrane. In some examples, the lid may be formed as single monolithic component, such that the ceiling portion and the body portion are a single structure. In some examples, the ceiling portion may be a separate component from the body portion, and the ceiling portion may be coupled to the body portion (e.g., pressed into the lid body portion). In some examples, the ceiling portion may include a top ceiling layer and a bottom ceiling layer, with the membrane (e.g., formed from a filter fabric) embedded therebetween.

In contrast with conventional packages, MEMS packages of the present disclosure do not utilize a gel in the package cavity to cover the MEMS device. Instead, example MEMS packages of the present disclosure may embed (and/or adhere) a membrane into a ceiling portion of the lid (e.g., by embedding the membrane between top and bottom ceiling layers or by adhering the membrane to a ceiling layer in the case of a monolithic lid). The use of an ePTFE membrane (for example), rather than a gel, provides advantages over conventional packages, including improved sensitivity performance (e.g., g-sensitivity performance, membrane sensitivity performance) and may allow protection of the MEMS device (e.g., a pressure sensor) from possible damage during lid handling.

In some examples, MEMS packages of the present disclosure may be utilized for one or more MEMS pressure sensors. In some examples, the MEMS package of the present disclosure may be used for MEMS pressure sensors. In general, the MEMS package of the present disclosure may be used with any MEMS pressure sensor. Moreover, although examples of the MEMS package of the present disclosure are described with respect to MEMS pressure sensors, the MEMS package is not limited to MEMS pressure sensors. In general, MEMS packages of the present disclosure may be configured to be utilized for any MEMS device, including a MEMS device which includes a sensor exposed to the (external) environment.

Figure 2:
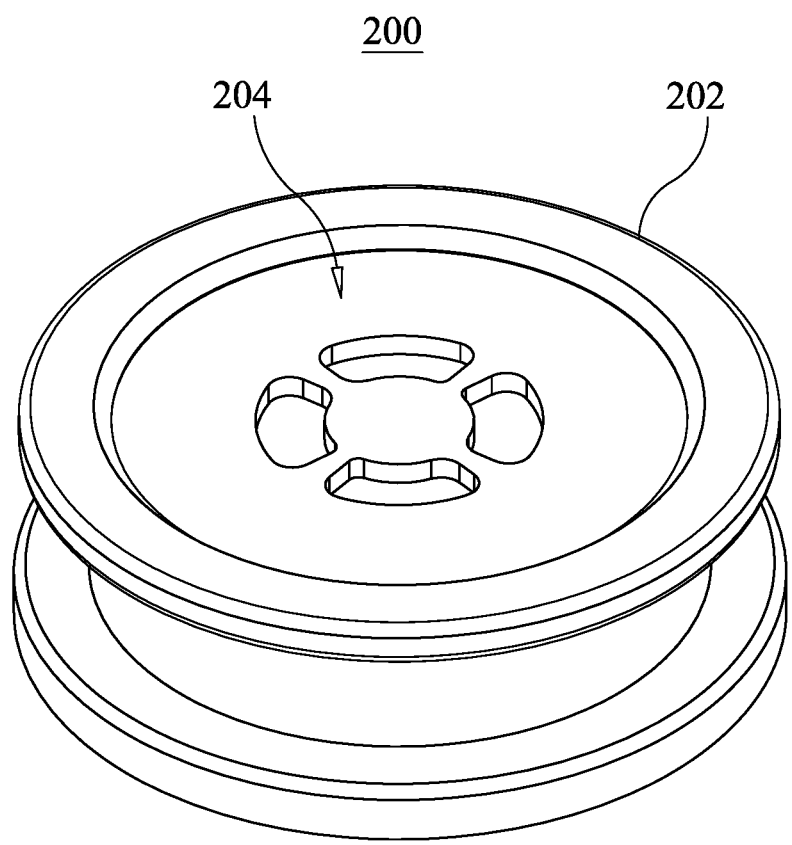
FIG. 2 is a perspective view diagram of an example lid of a MEMS package according to an aspect of the present disclosure.
Figure 3:
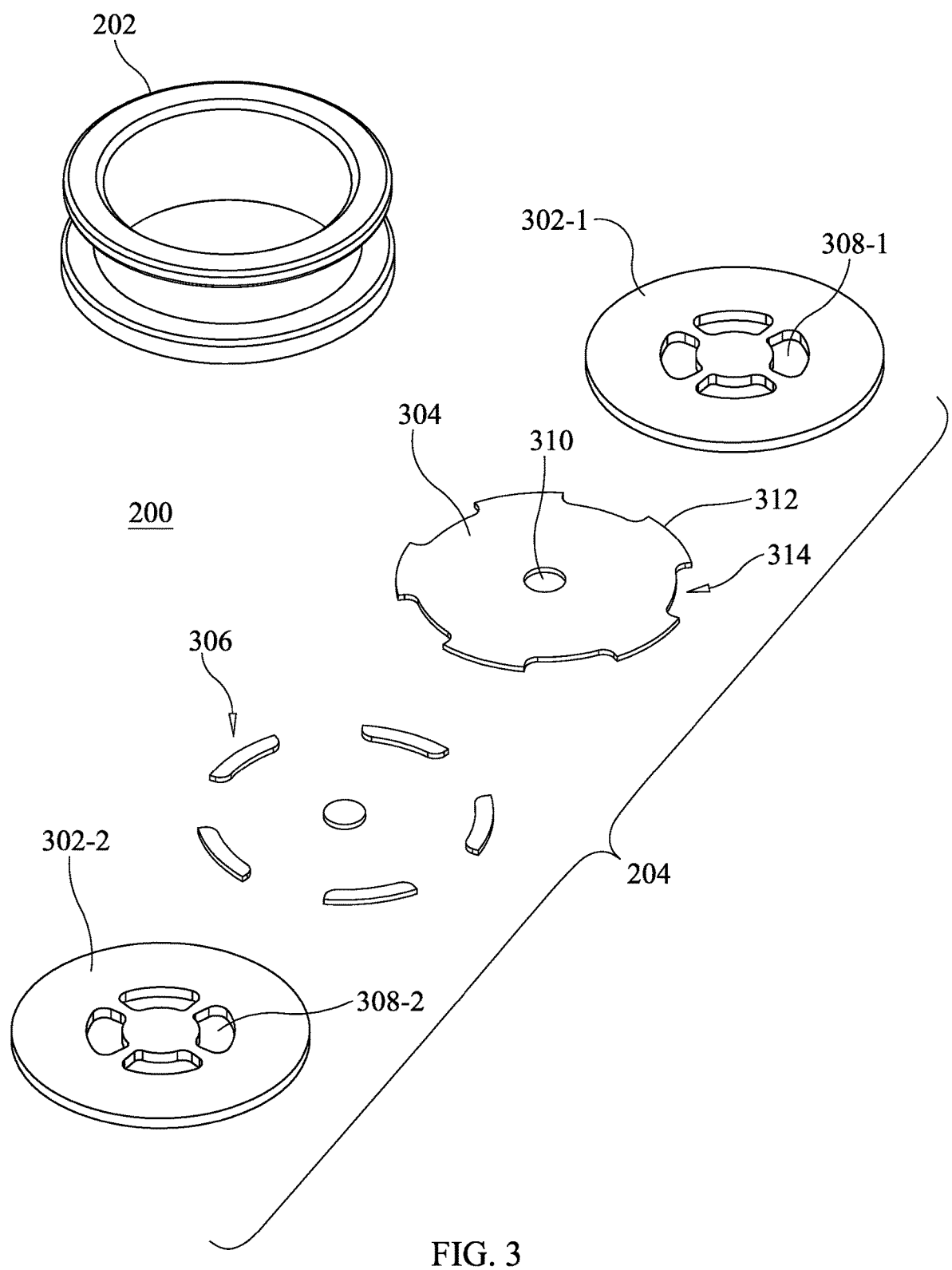
FIG. 3 is an exploded perspective view diagram of the example lid shown in FIG. 2, according to an aspect of the present disclosure.
Figure 4A:
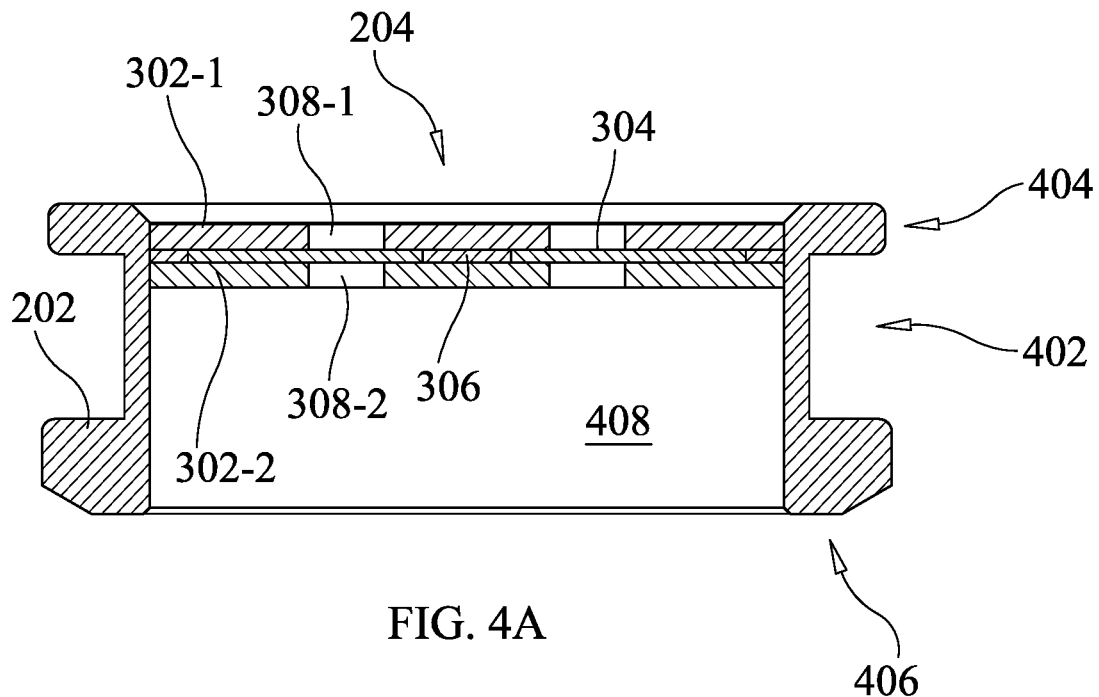
FIG. 4A is a cross-sectional view diagram of the lid shown in FIG. 2, according to an aspect of the present disclosure.
Figure 4B:
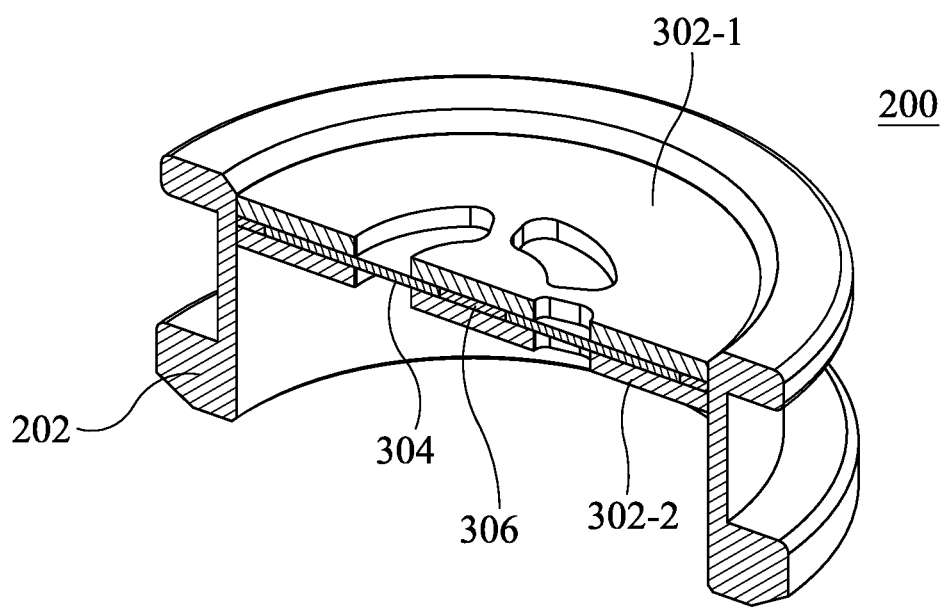
FIG. 4B is a cross-sectional perspective view diagram of the lid shown in FIG. 2, according to an aspect of the present disclosure.
Figure 5:
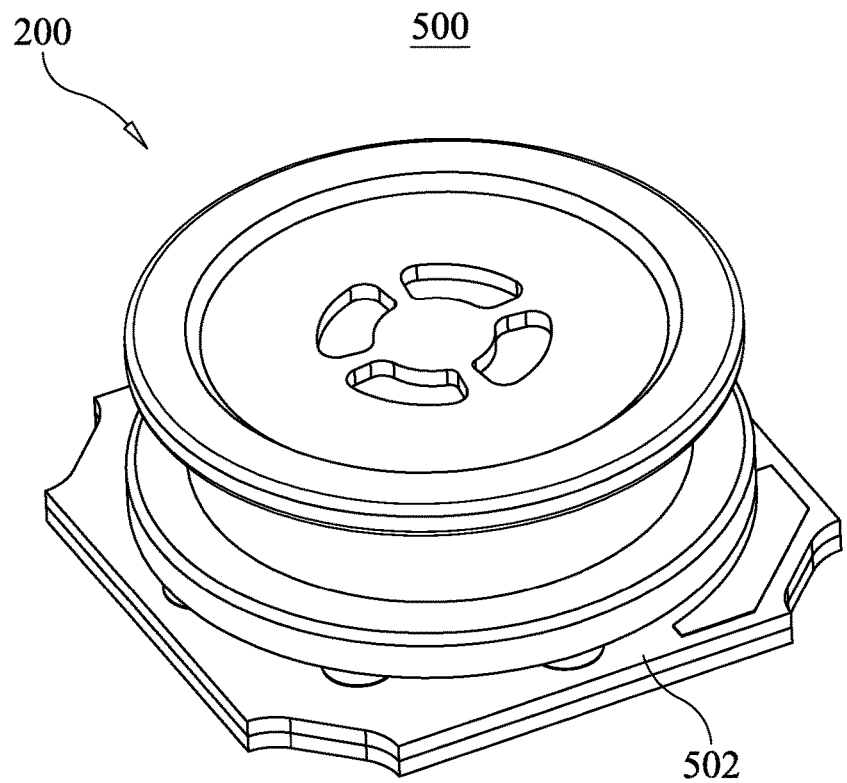
FIG. 5 is a perspective view diagram of an example MEMS package according to an aspect of the present disclosure.
Figure 6:
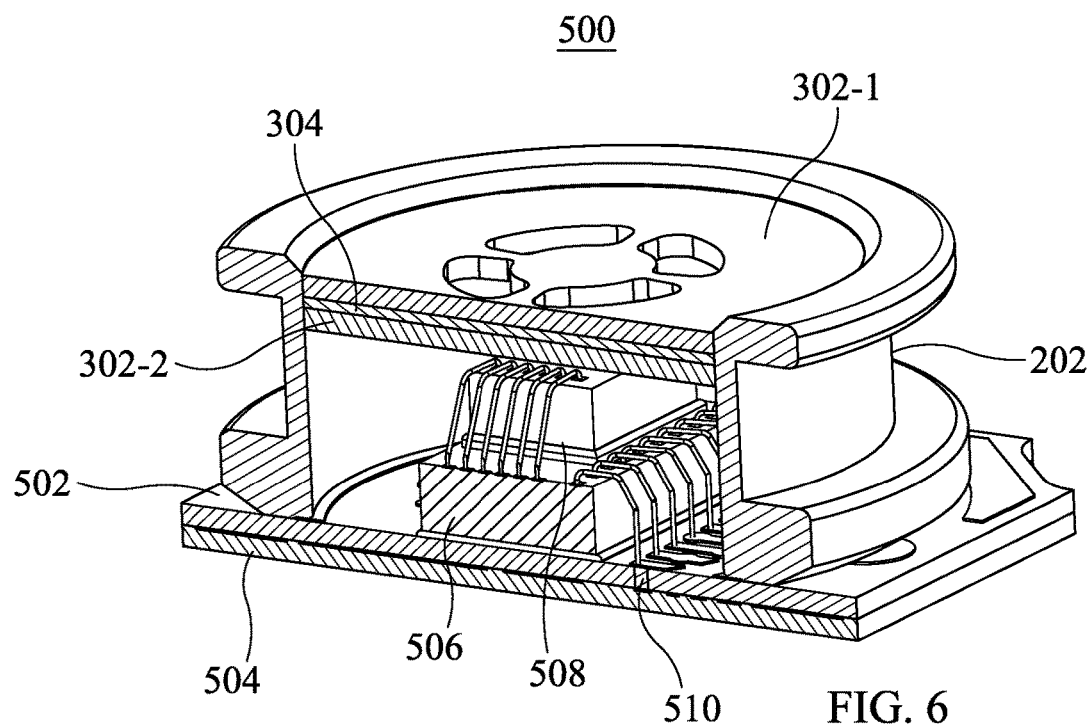
FIG. 6 is a cross-sectional perspective view diagram of the MEMS package shown in FIG. 5, according to an aspect of the present disclosure.

Referring next to FIGS. 2-6, example lid 200 of MEMS package 500 is shown, according to an aspect of the present disclosure. In particular, FIG. 2 is a perspective view diagram of lid 200; FIG. 3 is an exploded perspective view diagram of lid 200; FIG. 4A is a cross-sectional view diagram of lid 200; FIG. 4B is a cross-sectional perspective view diagram of lid 200; FIG. 5 is a perspective view diagram of example MEMS package 500; and FIG. 6 is a cross-sectional perspective view diagram of MEMS package 500.

Lid 200 is next described with respect to FIGS. 2-4B. Lid 200 may include body portion 202 and ceiling portion 204. Body portion 202 may include sidewall region 402, top portion region 404 and base portion region 406 (FIG. 4A). Body portion 202 may be configured to be coupled to ceiling portion 204 within a vicinity of top portion region 404. Body portion 202 may also be configured to be coupled to base substrate 502 (FIG. 5) via base portion region 406. When body portion 202 is coupled to ceiling portion 204, the combination may be configured to form cavity 408 therein.

In some examples, base portion 202 may be configured as an annular ring and ceiling portion 204 may be configured as a disk shape, forming a cylindrically shaped cavity 408 therein. It is understood that the shape of lid 200 (as well as lid 702 shown in FIGS. 7A-8B and lid 918 shown in FIG. 9F) represents a non-limiting example, and that lid 200 (702, 918) may be formed of any suitable symmetric shape (e.g., cylindrical, cube, cuboid, etc.) and/or any suitable non-symmetric shape.

As best shown in FIGS. 3 and 4A, ceiling portion 204 may include first ceiling layer 302-1, second ceiling layer 302-2 and membrane 304 embedded therebetween. Membrane 304 may be formed from a filtering fabric and may be configured to substantially block one or more of liquids (e.g., water) and contaminants (e.g., particulates) from passing into cavity 408 and infiltrating package 500. In some embodiments, the filtering fabric may include any suitable ePTFE material. In some examples, at least one of a hydrophobic coating and an oleophobic coating may be disposed on the filtering fabric that forms membrane 304.

Figure 9A:
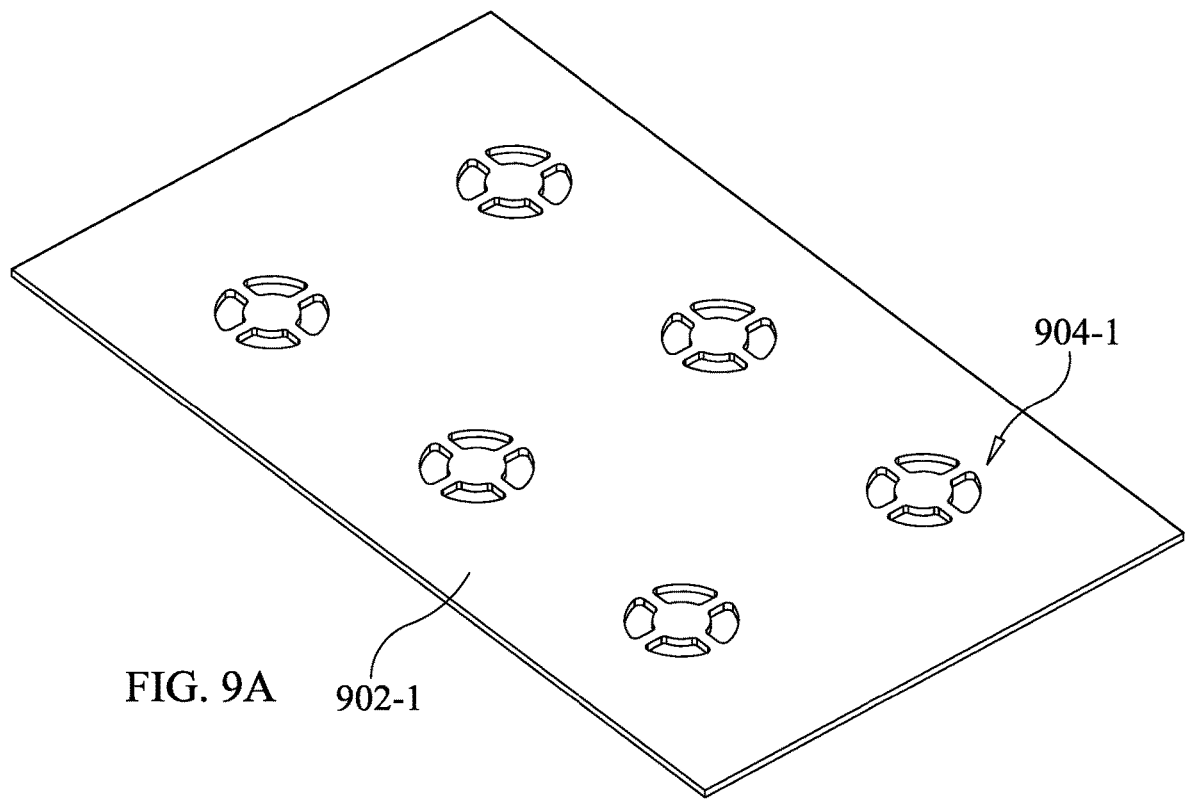
FIGS. 9A, 9B, 9C, 9D, 9E and 9F are perspective view diagrams illustrating an example process for making one or more lids of one or more MEMS packages, according to an aspect of the present disclosure.
Figure 9B:
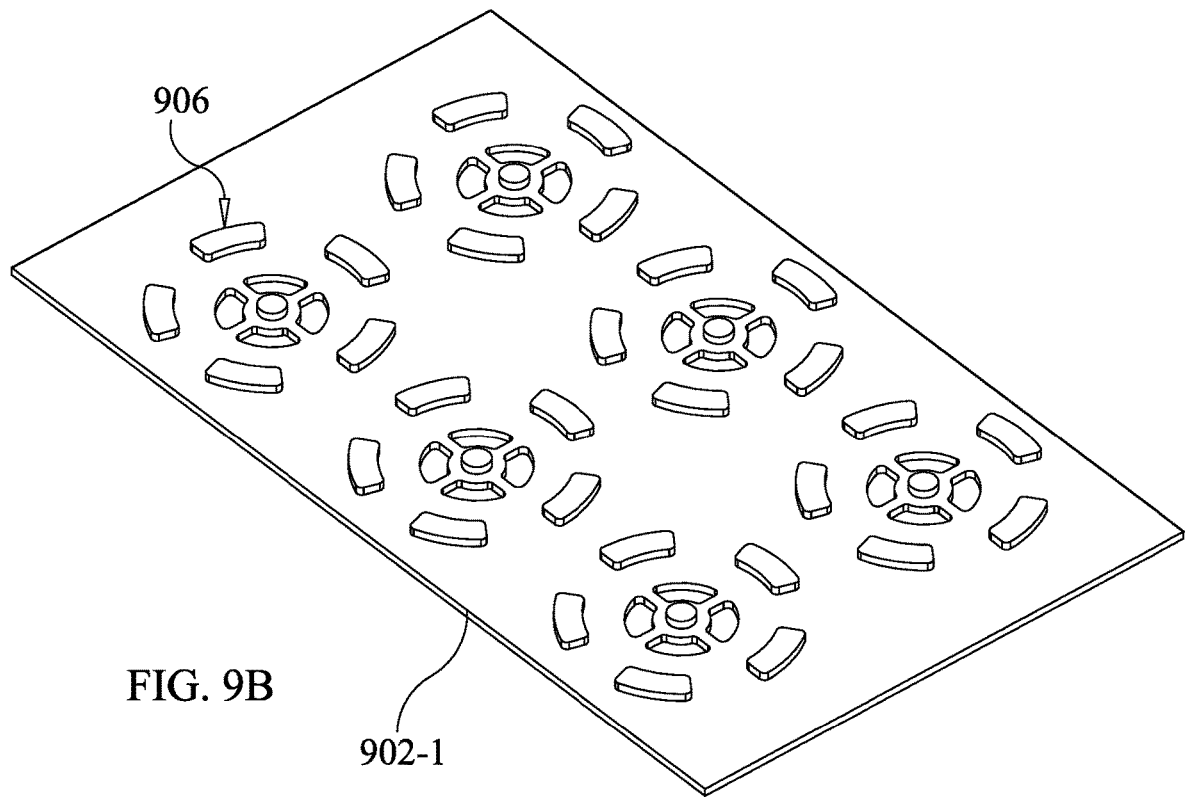
Figure 9C:
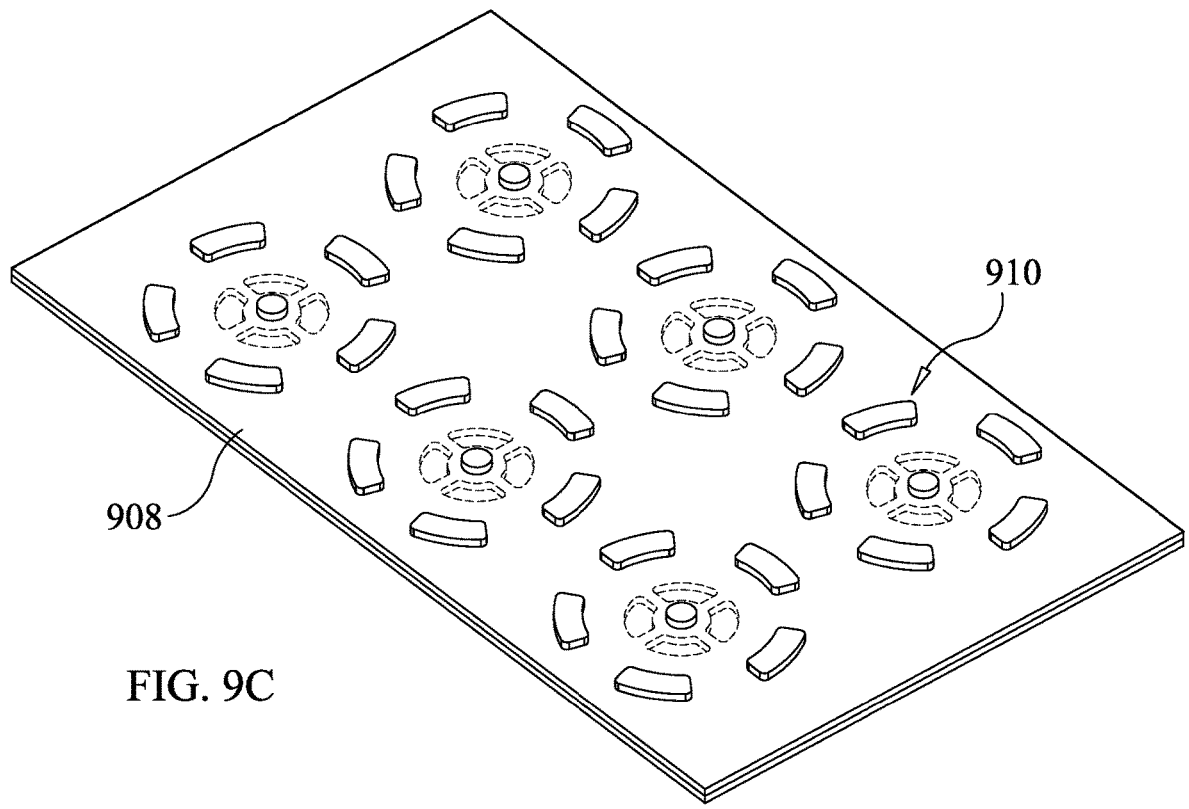
Figure 10A:
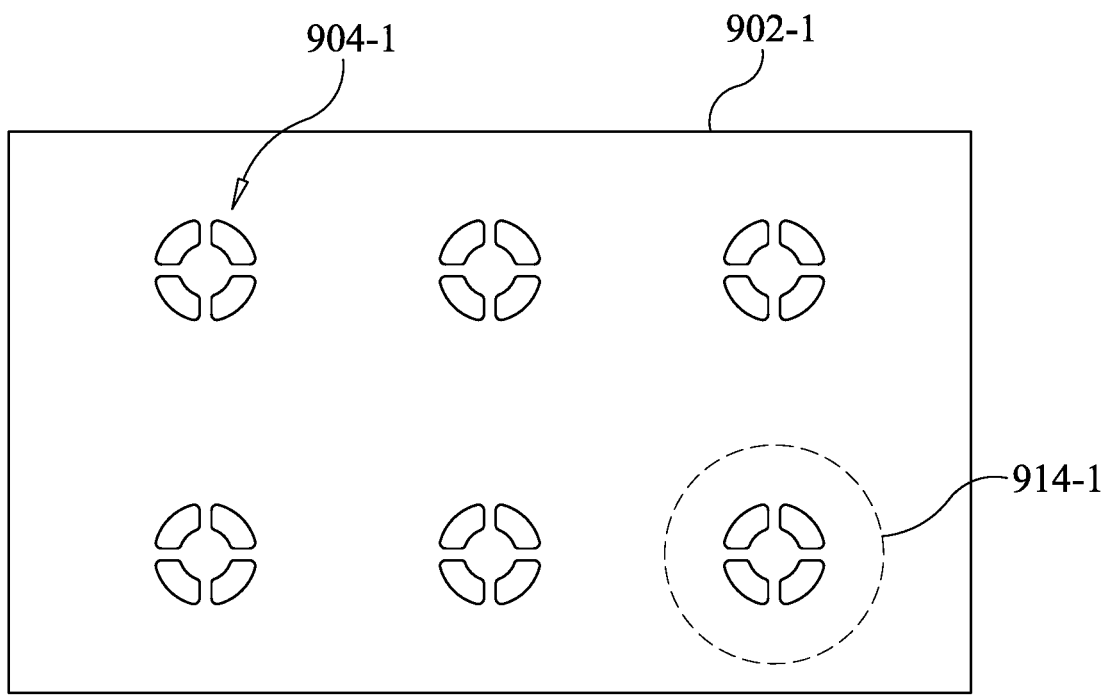
FIGS. 10A, 10B, 10C, 10D and 10E are overhead view diagrams illustrating an example process for making one or more lids of one or more MEMS packages, according to an aspect of the present disclosure.
Figure 10B:
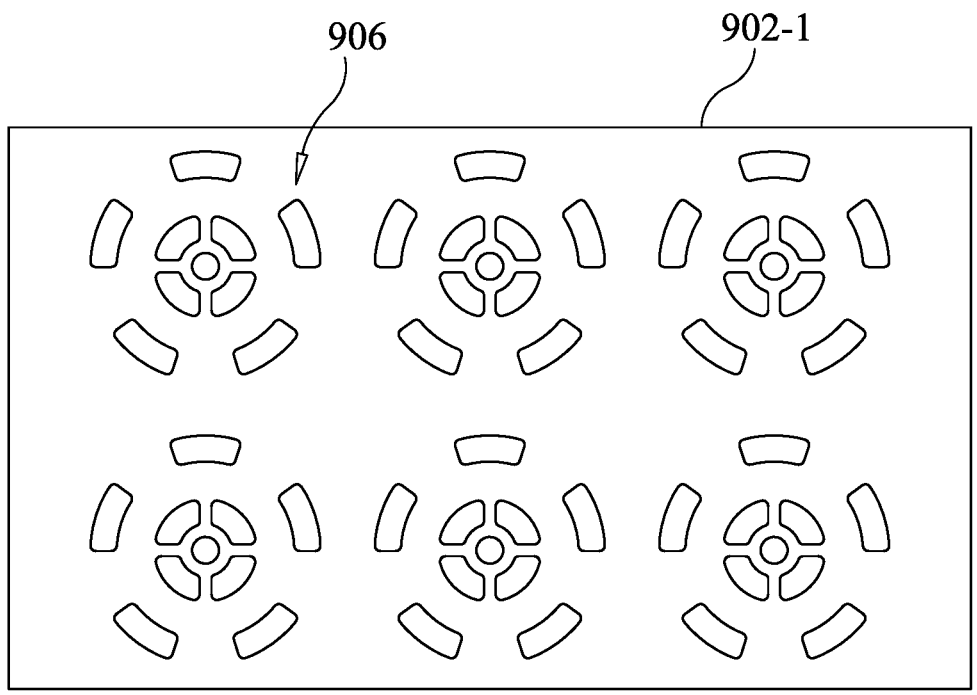
Figure 10C:
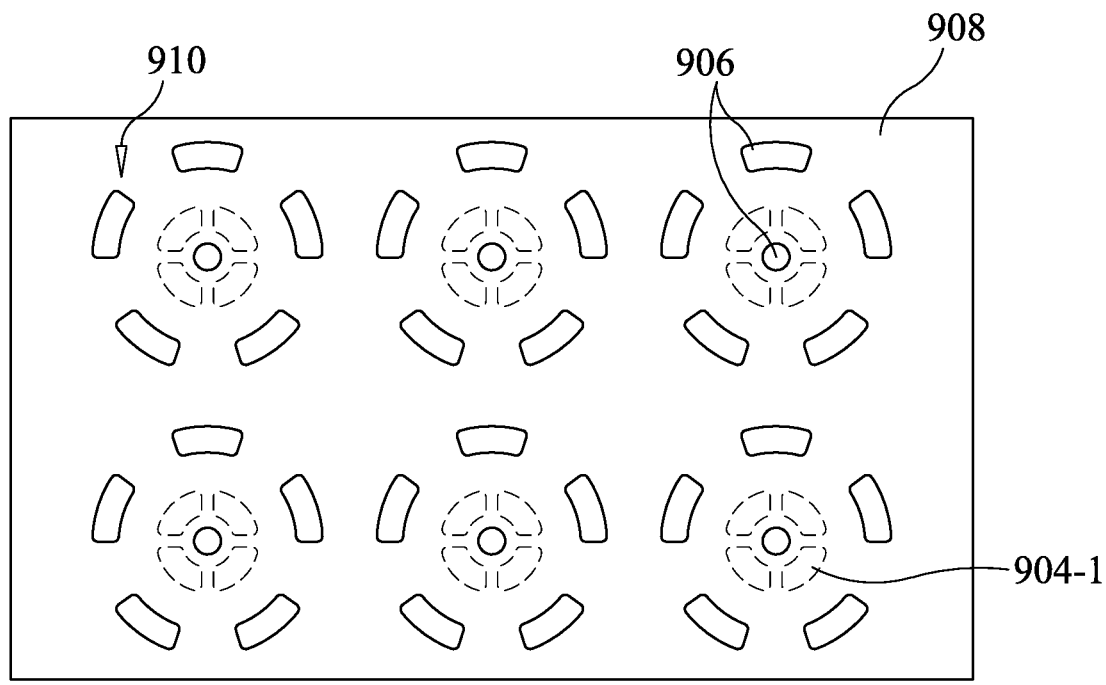

In some examples, membrane 304 may include one or more holes 304 arranged in a predetermined pattern (one hole illustrated in FIG. 3 and multiple holes 910 shown in FIGS. 9C and 10C). In some examples, membrane 304 may include one or more protrusions 312 extending from an edge of membrane 304 to form regions 314 between protrusions 312 that do not include any membrane material. In some examples, membrane 304 may include a uniform perimeter (e.g., formed in a circle) so as not to include any protrusions 312 (and may include more than one hole 310).

In some examples, first ceiling layer 302-1 may be adhered directly to second ceiling layer 302-2 by adhesive 306 arranged in a pattern such that adhesive 306 is configured to be aligned with hole 310 (or holes 910) and/or any regions 314 not including membrane 304. In this manner, as best shown in FIG. 4A, first ceiling layer 302-1 may be adhered to second ceiling layer 302-2 (via adhesive 306) without adhering membrane 304 to first and second ceiling layers 302-1, 302-2 (while still embedding membrane 304 between first and second ceiling layers 302-1, 302-2). In some examples, membrane 304 may be adhered to one or more of first ceiling layer 302-1 and second ceiling layer 302-1 (via any suitable adhesive 306). Adhesive 306 may include any adhesive material having suitable properties given an application of MEMS package 500. In a non-limiting example, adhesive 306 may include an epoxy resin.

In some examples, each of first and second ceiling layers 302-1, 302-2 may include one or more respective holes 308-1 and 308-2 (i.e., one or more apertures) extending therethrough. Hole(s) 308-1 and hole(s) 308-2 (i.e., one or more apertures) may be arranged in a same pattern so that hole(s) 308-1 and hole(s) 308-2 are configured to be aligned (as best shown in FIGS. 4A and 4B). In some examples, hole(s) 308-1, 308-2 may form one or more acoustic ports to expose MEMS device 508 (FIG. 6) in cavity 408 to an external (ambient) environment.

As shown in FIGS. 4A and 4B, membrane 304 may be configured to be in contact with each of first ceiling layer 302-1 and second ceiling layer 302-2. Membrane 304 may be configured to cover holes 308-1, 308-2 in respective ceiling layers 302-1, 302-2. In some examples, holes 308-1, 308-2 in respective ceiling layers 302-1, 302-2 may be configured to allow environmental pressure to reach MEMS device 508 (such as a pressure sensor (also referred to herein as a transducer)), while membrane 304 may act as a filter to protect MEMS device 508 from water (e.g., to provide waterproofing), from other liquids and contamination (e.g., according to a desired ingress protection rating (IPXX)).

It is understood that the dimension of holes 308-1, 308-2 in ceiling layers 302-1, 302-2, the shape of the holes, and the quantity of the holes may be varied depending on desired air flow area. It is also understood that properties of membrane 304, a density of membrane 304 and/or a permeability of membrane 304 may be changed depending on a desired level of protection (e.g., which may depend on a transducer application). In some examples, first ceiling layer 302-1 and second ceiling layer 302-2 may be configured to fully support membrane 304, limiting a deflection of membrane 304.

In some examples, lid 200 (e.g., body portion 202 and/or ceiling layers 302-1, 302-2) may be formed from a conductive material including a metal. In some examples, the metal may include, without being limited to, one or more of stainless steel, plated brass, plated aluminum and nickel. In some examples, lid 200 (e.g., body portion 202 and/or ceiling layer(s) 302-1, 302-2) may be formed from a polymer. In general, the material of lid 200 may include one material or may include any combination of materials having suitable properties for protecting MEMS device 508 such as a pressure sensor. In some examples, ceiling portion 204 and body portion 202 of lid 200 may be formed from a same material. In some examples, ceiling portion 204 and body portion 202 of lid 200 may be formed from different materials.

Referring next to FIGS. 5 AND 6, MEMS package 500 having lid 200 is shown. In an example embodiment, MEMS package 500 may include base substrate 502, at least one integrated circuit 506 (e.g., an application-specific integrated circuit (ASIC)) disposed on base substrate 502, MEMS device 508 (e.g., a MEMS pressure sensor) disposed on and connected to integrated circuit(s) 506 and lid 200 coupled to base substrate 502 (e.g., via base portion region 406). MEMS package 500 may further include one or more connectors, wire bonds, bond pads and the like. MEMS package 500 may also include one or more additional layers 504 (e.g., one or more interconnect layers) which may be configured for directing electrical connection(s) of one or more structures on base substrate 502, such as through one or more vias 510. Lid 200 may be configured to cover MEMS device 508 (so that MEMS device 508 is enclosed within cavity 408) and to provide waterproofing and contamination protection of MEMS device 508.

As discussed above, MEMS device 508 may include any type of device and/or sensor for which protection from fluids and/or contaminants may be desired, including in applications where exposure of MEMS device 508 to an external environment is desired. In a non-limiting example, MEMS device 508 may include a MEMS pressure sensor.

MEMS package 500 (as well as MEMS package 700 shown in FIG. 7A) may be used as part of any device for which MEMS device 508 (such as a pressure sensor) is useful, including environments that may include exposure to fluids and/or contaminants. Non-limiting examples of devices which may include at least one MEMS package 500 include one or more of a wearable device, a mobile phone, an electronic notebook, a laptop, a computer and the like.

Figure 7A:
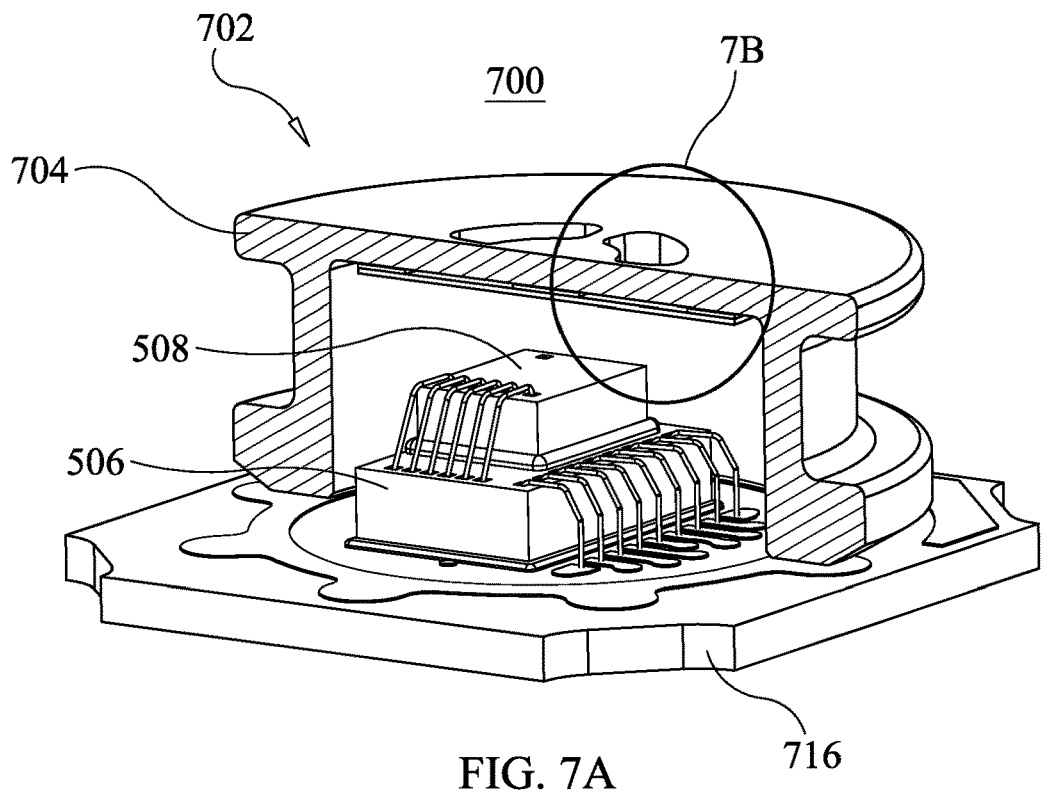
FIG. 7A is a cut-away perspective view diagram of an example MEMS package according to another aspect of the present disclosure.
Figure 7B:
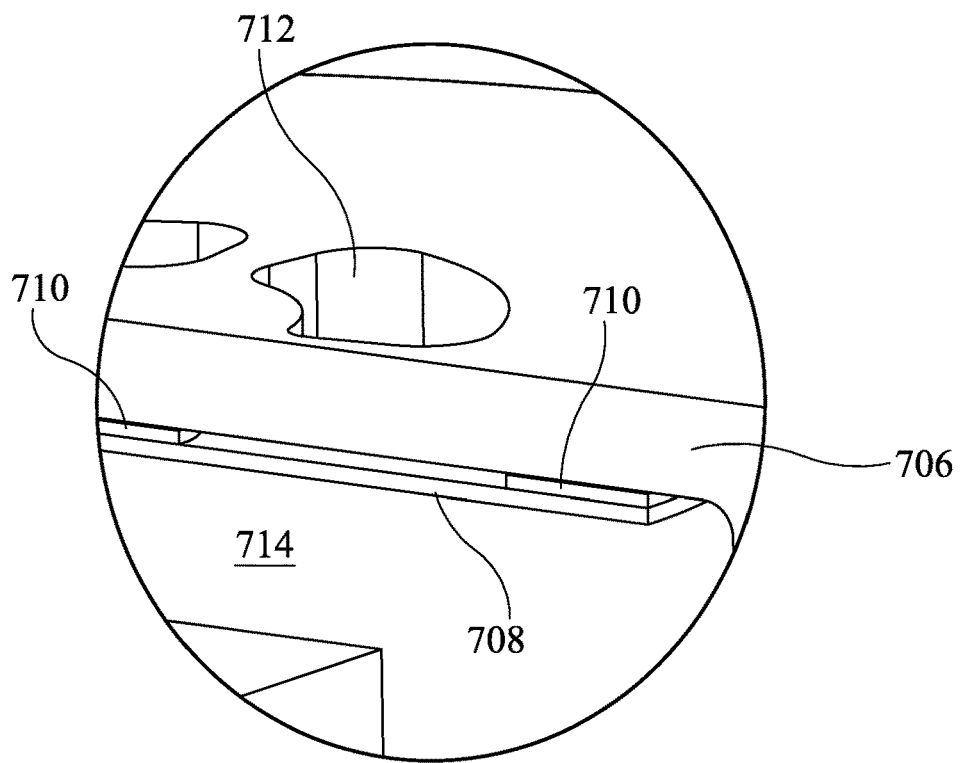
FIG. 7B is a detail view of a portion 7B of FIG. 7A, according to an aspect of the present disclosure.
Figure 8A:
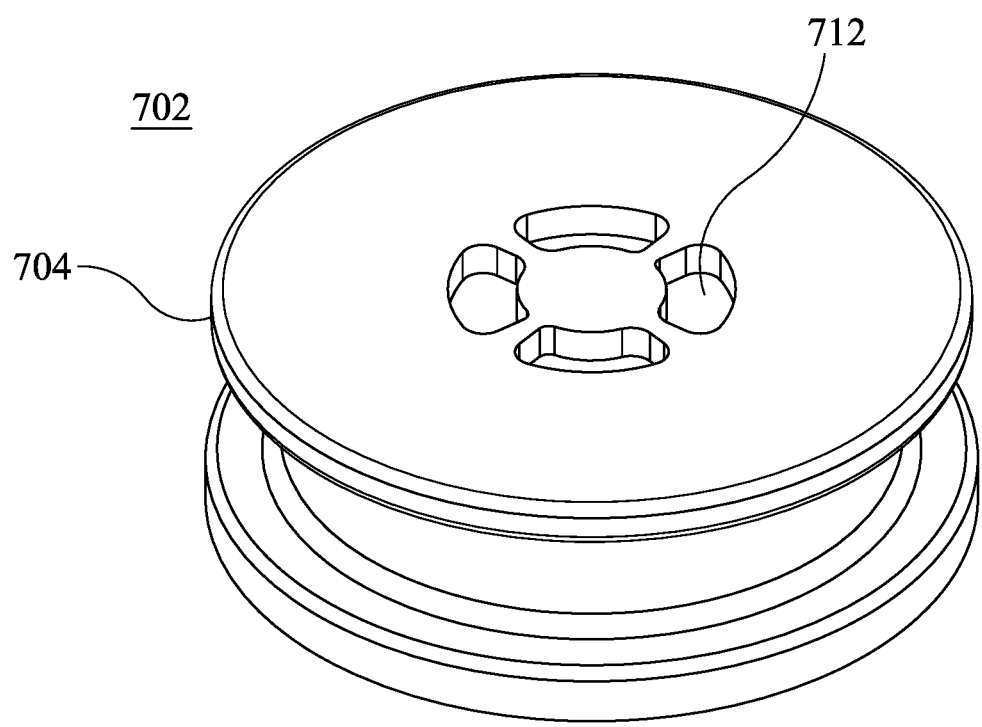
FIG. 8A is a perspective view diagram of the lid shown in FIG. 7, according to an aspect of the present disclosure.
Figure 8B:
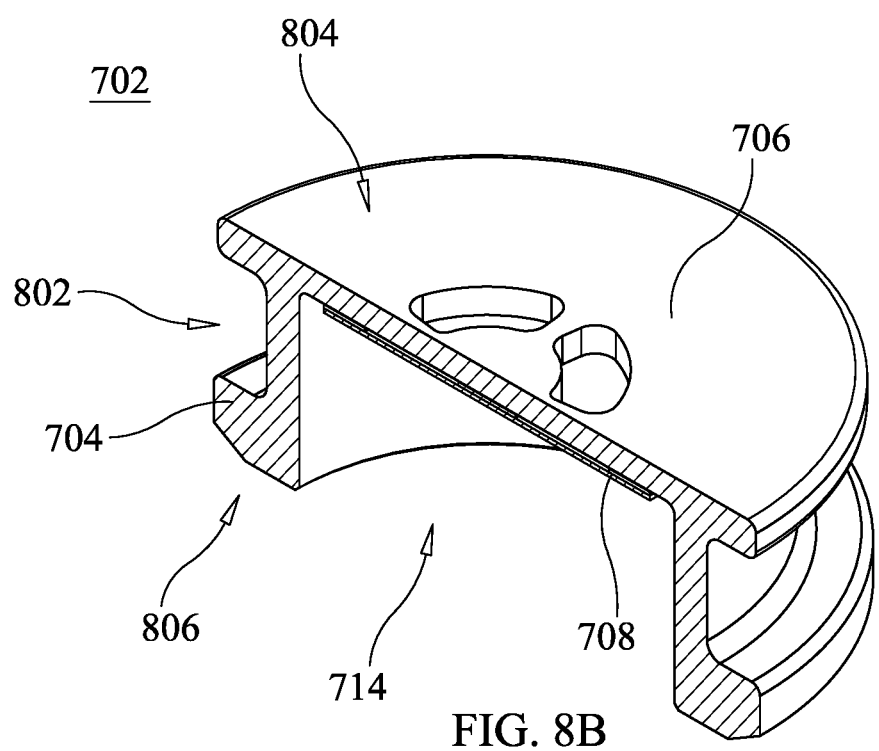
FIG. 8B is a cross-sectional perspective view diagram of the lid shown in FIG. 8A, according to an aspect of the present disclosure.

Referring next to FIGS. 7A-8B, example MEMS package 700 having lid 702 is shown, according to another aspect of the present disclosure. In particular, FIG. 7A is a cut-away perspective view diagram of MEMS package 700; FIG. 7B is a detail view of portion 7B illustrating details of a portion of lid 702; FIG. 8A is a perspective view diagram of lid 702; and FIG. 8B is a cross-sectional perspective view diagram of lid 702.

Similar to MEMS package 500, MEMS package 700 may include base substrate 716, at least one integrated circuit 506 (e.g., an ASIC) disposed on base substrate 716, MEMS device 508 (e.g., a MEMS pressure sensor) disposed on and connected to integrated circuit(s) 506 and lid 702 coupled to base substrate 716. MEMS package 700 may further include one or more connectors, wire bonds, bond pads and the like. Although not shown, MEMS package 700 may also include one or more additional layers (similar to layer(s) 504). Lid 702 may be configured to cover MEMS device 508 (so that MEMS device 508 is enclosed within cavity 714) and to provide waterproofing and contamination protection of MEMS device 508.

Lid 702 is similar to lid 200 in that lid 702 may include body portion 802 and ceiling portion 804 (best shown in FIG. 8B). Lid 702 is different from lid 200 in that lid 702 may be formed as single monolithic component, from monolithic material 704, such that body portion 802 and ceiling portion 804 are a single structure.

For example, as best shown in FIG. 7B, ceiling portion 804 may include one ceiling layer 706 (integrated with lid body portion 804), with membrane 708 attached underneath ceiling layer 706 (e.g., adhered to ceiling layer 706 via adhesive 710). In general, membrane 708 may be adhered to ceiling layer 706 via adhesive 710 in such a manner so that membrane 708 may be configured to substantially block one or more of liquids and contaminants from passing into cavity 714. Membrane 708 is similar to membrane 304 in that membrane 708 may be formed from a filtering fabric, and that in some embodiments, the filtering fabric may include any suitable ePTFE material. Adhesive 710 is similar to adhesive 306. In some examples, at least one of a hydrophobic coating and an oleophobic coating may be disposed on the filtering fabric forming membrane 708. Although FIG. 7B appears to illustrate a gap between membrane 708 and ceiling layer 706, this is only to illustrate regions of adhesive 710 between membrane 708 and ceiling layer 706. In practice, membrane 708 may be disposed on ceiling layer 706 and coupled to ceiling layer 706 via adhesive 710.

In some embodiments, ceiling layer 706 may include one or more holes 712 (i.e., one or more apertures) extending therethrough. Membrane 708 may be configured to cover hole(s) 712. Hole(s) 712 are similar to holes 308-1, 308-2. In some examples, hole(s) 712 may form one or more acoustic ports to expose MEMS device 508 in cavity 714 to an external (ambient) environment. Similar to hole(s) 308-1, 308-2, the shape of hole(s) 712, and the quantity of hole(s) 712 may be varied depending on desired air flow area. It is also understood that, similar to membrane 304, properties of membrane 708, a density of membrane 708 and/or a permeability of membrane 708 may be changed depending on a desired level of protection (e.g., which may depend on a transducer application). In some examples, adhesive 710 may be applied between membrane 708 and ceiling layer 706 in a manner to provide a seal around each hole 712, to substantially block fluids and/or contaminants from entering cavity 714 via hole(s) 712.

In some examples, monolithic material 704 may be formed from a conductive material including a metal. In some examples, the metal may include, without being limited to, one or more of stainless steel, plated brass, plated aluminum and nickel. In general, material 704 of lid 702 may include one material or may include any combination of materials having suitable properties for protecting MEMS device 508 such as a pressure sensor.

Although FIGS. 7A-8B describe lid 702 formed from a monolithic material 704, in some examples, ceiling portion 804 may be a separate component from body portion 802, and ceiling portion 804 may be coupled to body portion 802 (e.g., pressed into the lid body portion). In some examples, ceiling portion 804 and body portion 802 of lid 702 (of separate components) may be formed from a same material. In some examples, ceiling portion 804 and body portion 802 of lid 702 (of separate components) may be formed from different materials.

Referring next to FIGS. 9A-10E, an example process is shown for making one or more lids 918 of one or more housing packages (such as MEMS package 500), where each housing package is configured to enclose a MEMS device (e.g., MEMS device 508), according to an aspect of the present disclosure. In particular, FIGS. 9A-9F are perspective view diagrams illustrating the example process; and FIGS. 10A-10E are overhead view diagrams illustrating the example process.

Referring to FIGS. 9A and 10A, at a first step, a first (e.g., bottom) ceiling sheet 902-1 may be formed having multiple first hole sets 904-1 arranged in a first pattern. In first ceiling sheet 902-1, each first hole set 904-1 is associated with first ceiling component 914-1, such that first ceiling sheet 902-1 includes plural (i.e., a matrix) of first ceiling components (for multiple lids). Although each first hole set 904-1 is illustrated as including plural holes, in general, first hole set 904-1 may include one or more holes. First ceiling sheet 902-1 may be formed from a metal material. In some examples, the metal material may include, without being limited to, one or more of stainless steel, plated brass, plated aluminum and nickel.

Referring to FIGS. 9B and 10B, at a second step, glue 906 (or any suitable adhesive more generally) may be disposed on first ceiling sheet 902-1 in a predetermined glue pattern (e.g., via glue printing).

Referring to FIGS. 9C and 10C, at a third step, membrane sheet 908 may be disposed on first ceiling sheet 902-1 (e.g., via roll lamination). In some examples, membrane sheet 908 may be pre-cut during a punch step (not shown), such that membrane sheet 908 may include multiple second hole sets 910 having a second pattern. Membrane sheet 908 may be disposed on first ceiling sheet 902-1 such that glue pattern 906 (also shown in FIGS. 9C and 10C) is aligned with second hole sets 910 of membrane sheet 908 (having the second pattern), so that glue pattern 906 is exposed through second hole sets 910 of membrane sheet 908. FIGS. 9C and 10C also illustrate the position of first hole sets 904-1 associated with each first ceiling component 914-1. Membrane sheet 908 may be formed from a filtering fabric and may be configured to substantially block passage of one or more of liquids and contaminants. In some embodiments, the filtering fabric may include any suitable ePTFE material. In some examples, at least one of a hydrophobic coating and an oleophobic coating may be disposed on at least a portion of membrane sheet 908.

Figure 9D:
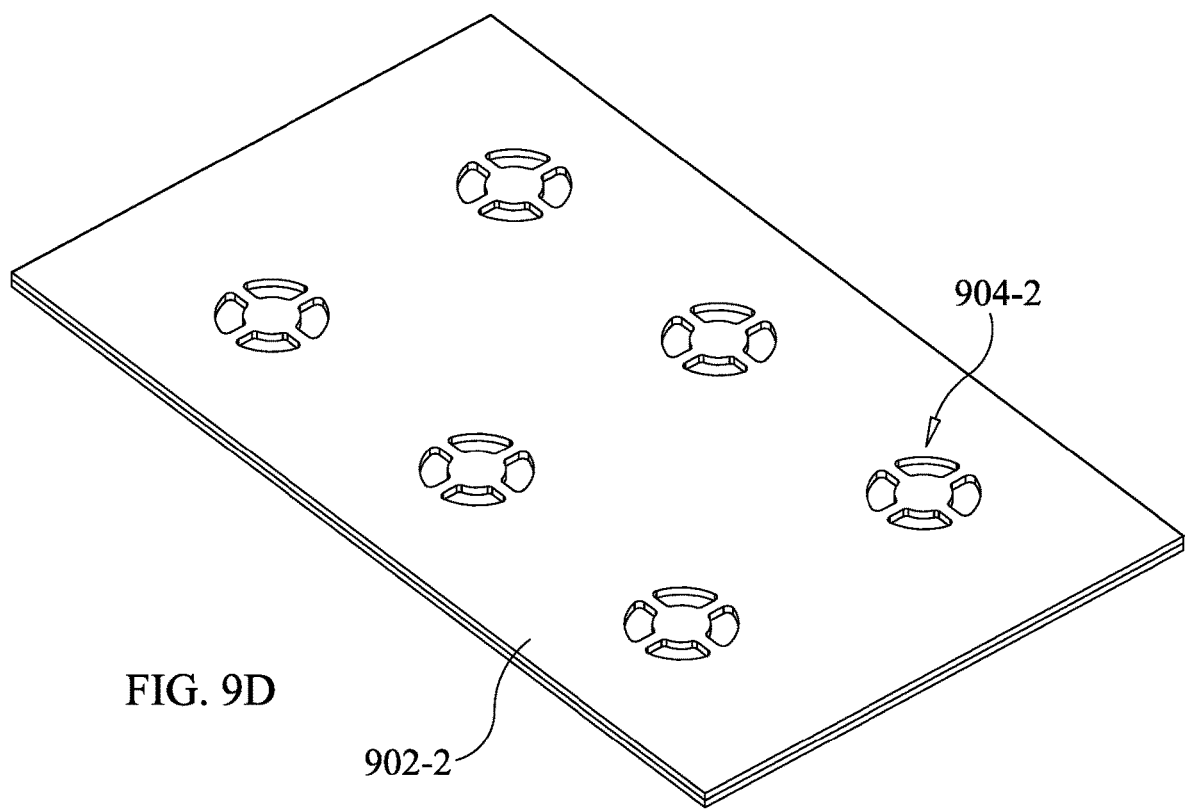
Figure 10D:
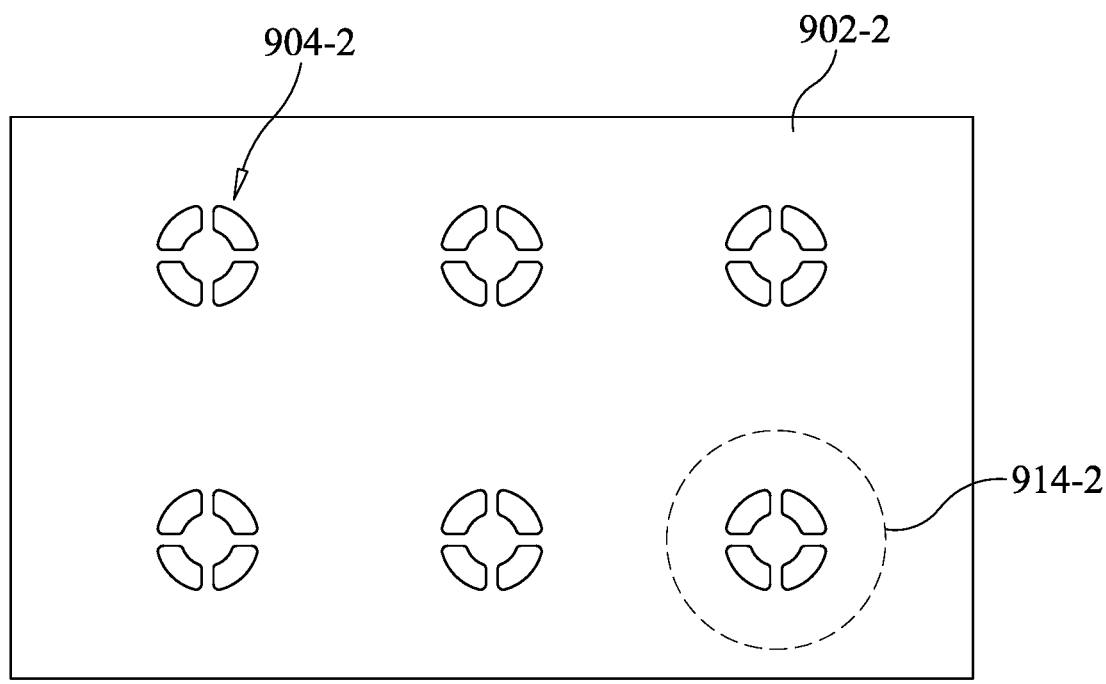

Referring to FIGS. 9D and 10D, at a fourth step, second (e.g., top) ceiling sheet 902-2 is patterned with plural third hole sets 904-2 and disposed on membrane sheet 908 (e.g., via strip lamination). Third hole sets 904-2 have a third pattern that correspond to and are aligned with the first pattern of first hole sets 904-1. In second ceiling sheet 902-2, each third hole set 904-2 is associated with second ceiling component 914-2, such that second ceiling sheet 902-2 includes plural (i.e., a matrix) of second ceiling components (for multiple lids).

By disposing second ceiling sheet 902-2 on membrane sheet 908, glue pattern 906 (exposed through second hole sets 910 of membrane sheet 908) contact the second ceiling sheet 902-2, thereby adhering second ceiling sheet 902-2 to first ceiling sheet 902-1 (via glue pattern 906), and embedding membrane sheet 908 between first ceiling sheet 902-1 and second ceiling sheet 902-2, to form a combined ceiling sheet. In this manner, first hole set 904-1 and third hole sets 904-2 (of respective first ceiling sheet 902-1 and second ceiling sheet 902-2) are covered by membrane sheet 908, thereby providing waterproofing and contamination protection of the combined ceiling sheet. Second ceiling sheet 902-2 may be formed from a metal material. In some examples, the metal material may include, without being limited to, one or more of stainless steel, plated brass, plated aluminum and nickel.

Figure 9E:
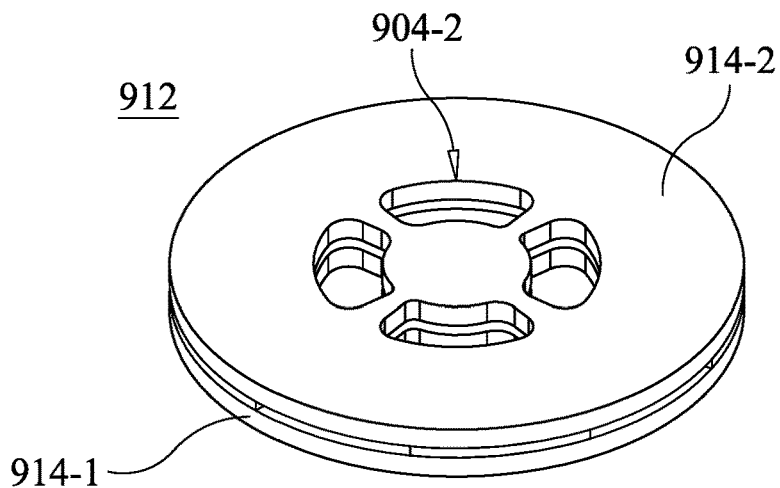
Figure 9F:
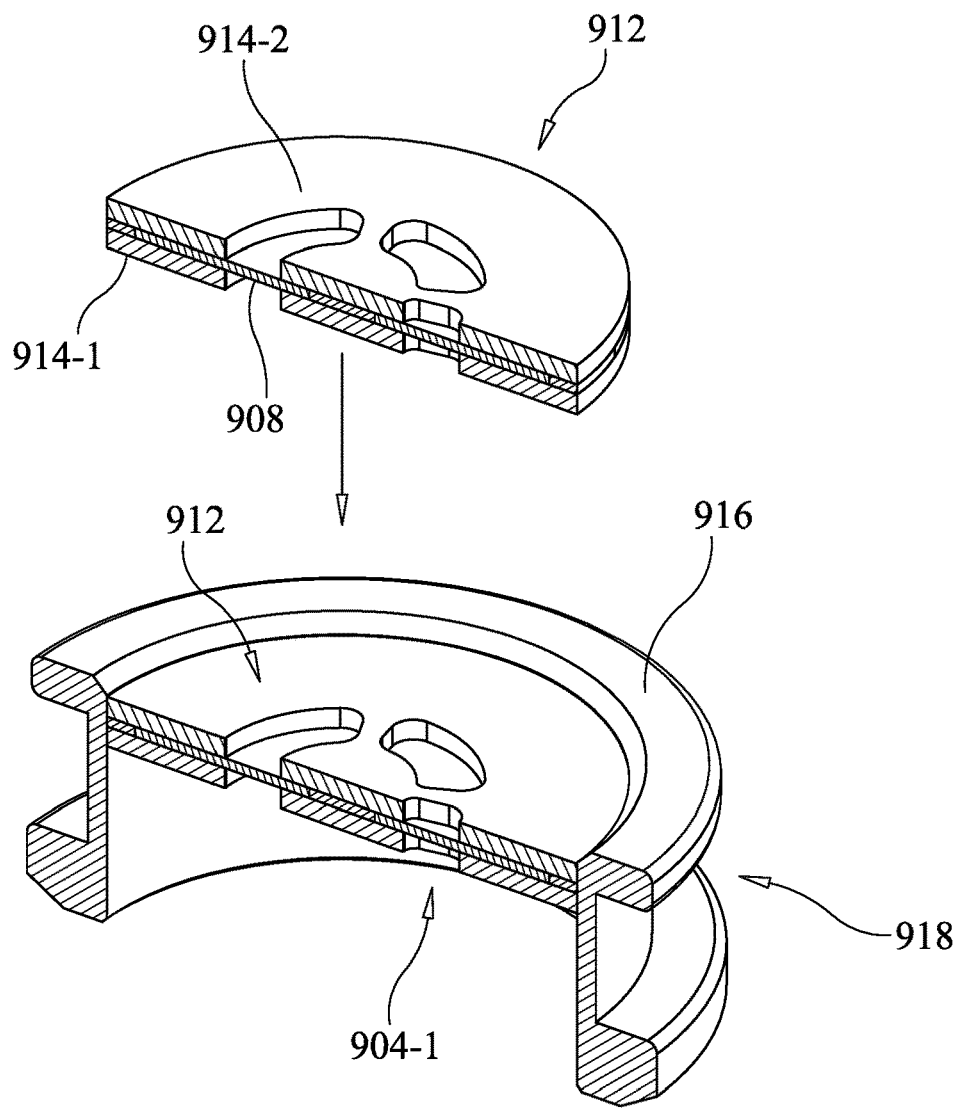
Figure 10E:
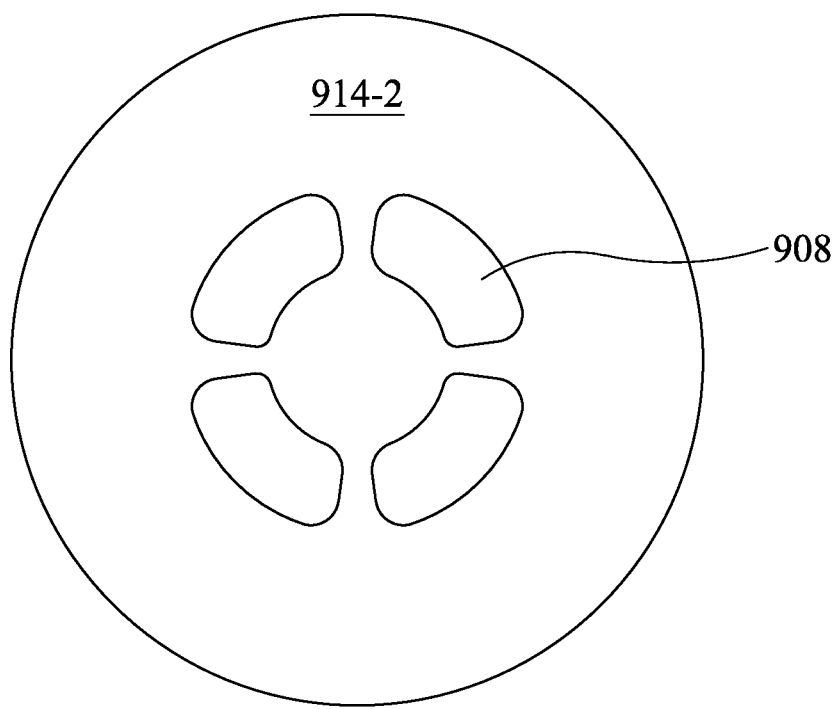

Referring to FIGS. 9E and 10E, at a fifth step, strip punching may be applied to the combined ceiling sheet (formed in the fourth step) to form a number of disks, where each disk represents ceiling portion 912 of lid 918 (FIG. 9F). Ceiling portion 912 includes a portion of membrane sheet 908 embedded between first ceiling component 914-1 and second ceiling component 914-2. Ceiling portion 912 also includes first hole set 904-1 (shown in FIG. 9F) in first ceiling component 914-1 and third hole set 904-2 in second ceiling component 914-2, with a portion of membrane sheet covering first and third hole sets 904-1, 904-2. In this manner, ceiling portion 912 allows a MEMS device to be exposed to an external environment while substantially blocking fluids and/or contaminates from passing into an interior of lid 918.

Referring to FIG. 9F, at a sixth step, ceiling portion 912 (formed at the fifth step) may be coupled to body portion 916 to form lid 918 for a MEMS package (e.g., MEMS package 500). In some examples, ceiling portion 912 may be press fitted to body portion 916. In some examples, body portion 916 and/or ceiling portion 912 may be heated prior to and/or during the press fit process. In some examples, a conductive adhesive (such as a conductive epoxy) may be used in place of or as part of the press fit process.

Body portion 916 may be formed from a metal material. In some examples, the metal material may include, without being limited to, one or more of stainless steel, plated brass, plated aluminum and nickel. In some examples, ceiling portion 912 and body portion 916 of lid 918 may be formed from a same material. In some examples, ceiling portion 912 and body portion 916 of lid 918 may be formed from different materials.

In some embodiments, the process shown in FIGS. 9A-10E may represent an example process for embedding an ePTFE filter in metal lid 918.

While the present disclosure has been discussed in terms of certain embodiments, it should be qualified that the present disclosure is not so limited. The embodiments are explained herein by way of example, but there are numerous modifications, variations and other embodiments that may be employed that would still be within the scope of the present disclosure.

What is claimed:

1. A microelectromechanical system (MEMS) package comprising:
    at least one MEMS device disposed on a base substrate; and
    a lid disposed on the base substrate, the lid configured to enclose the at least one MEMS device,
    the lid comprising:
        a body portion configured to be coupled to the base substrate,
        a ceiling portion comprising first and second ceiling layers adhered together, the body portion and the ceiling portion forming a cavity in which the at least one MEMS device is enclosed, and
        a membrane embedded between the first and second ceiling layers of the ceiling portion without the membrane being adhered to the first and second ceiling layers, the membrane formed from a filtering fabric, the membrane configured to substantially block one or more of liquids and contaminants from passing into the cavity.

2. The MEMS package of claim 1, wherein the ceiling portion comprises a ceiling layer, the membrane configured to be adhered to the ceiling layer.

3. The MEMS package of claim 1, wherein the body portion and the ceiling portion are formed as a monolithic structure.

4. The MEMS package of claim 1, further comprising at least one of a hydrophobic coating and an oleophobic coating disposed on the filtering fabric.

5. The MEMS package of claim 1, wherein the ceiling portion includes one or more holes.

6. The MEMS package of claim 5, wherein the membrane is configured to cover the one or more holes of the ceiling portion.

7. The MEMS package of claim 1, wherein the filtering fabric comprises an expanded polytetrafluoroethylene (ePTFE) material.

8. The MEMS package of claim 1, wherein the lid is formed from a conductive material comprising a metal.

9. The MEMS package of claim 8, wherein the metal comprises one or more of stainless steel, plated brass, plated aluminum and nickel.

10. The MEMS package of claim 1, wherein the at least one MEMS device comprises at least one MEMS pressure sensor.

11. The MEMS package of claim 1, wherein the membrane is configured to provide at least one of waterproofing and contamination protection of the at least one MEMS device.

12. The MEMS package of claim 1, wherein the body portion comprises an annular ring and the ceiling portion comprises a disk shape.

13. A method of making a microelectromechanical system (MEMS) package, the method comprising:
    forming a lid comprising a body portion and a ceiling portion such that the body portion and the ceiling portion form a cavity in which at least one MEMS device is configured to be enclosed;
    forming a membrane from a filtering fabric;
    disposing the membrane on the ceiling portion such that the membrane is in contact with the ceiling portion, the membrane configured to substantially block one or more of liquids and contaminants from passing into the cavity;
    disposing the lid on a base substrate such that the body portion of the lid is coupled to the base substrate, the base substrate including the at least one MEMS device disposed thereon;
    providing first and second ceiling layers, the first and second ceiling layers forming the ceiling portion; and
    coupling the ceiling portion to the body portion,
    wherein the disposing of the membrane further comprises embedding the membrane between the first and second ceiling layers, and
    wherein the first and second ceiling layers are adhered together without adhering the membrane to the first and second ceiling layers.

14. The method of claim 13, wherein the forming of the lid further comprises:
    forming the body portion and the ceiling portion as a monolithic structure; and
    adhering the membrane to the ceiling portion.

15. The method of claim 13, wherein the membrane is adhered to one or more of the first and second ceiling layers.

16. The method of claim 13, the method further comprising:
    disposing at least one of a hydrophobic coating and an oleophobic coating on the filtering fabric.

17. The method of claim 13, the method further comprising:
    forming one or more holes in the ceiling portion, wherein the membrane is configured to cover the one or more holes of the ceiling portion.

18. The method of claim 13, wherein the filtering fabric comprises an expanded polytetrafluoroethylene (ePTFE) material.

19. The method of claim 13, wherein the lid is formed from a material comprising one or more of a metal and a polymer.

20. The method of claim 19, wherein the metal comprising one or more of stainless steel, plated brass, plated aluminum and nickel.

21. A method of manufacturing a plurality of housing packages, each housing package configured to enclose a microelectromechanical system (MEMS) device, the method comprising:
    providing a first ceiling layer having a matrix of first ceiling components, each of said first ceiling components having one or more first holes arranged in a first pattern;

providing a second ceiling layer having matrix of second ceiling components, each of said second ceiling components having one or more second holes arranged in the first pattern;

providing a membrane layer comprising a filtering fabric;

embedding the membrane layer between the first ceiling layer and the second ceiling layer such that the matrix of first ceiling components align with the matrix of second ceiling components, to form a third ceiling layer;

separating the third ceiling layer to form a plurality of ceiling portions corresponding to the plurality of housing packages; and coupling the plurality of ceiling portions to a plurality of base portions to form the plurality of housing packages.

22. The method of claim 21, wherein the embedding of the membrane further comprises:

adhering the membrane layer to each of the first ceiling layer and the second ceiling layer.

23. The method of claim 21, wherein the embedding of the membrane further comprises:

forming one or more third holes in the membrane arranged in a second pattern, the second pattern being different form the first pattern;

disposing an adhesive agent on one of the first ceiling layer and the second ceiling layer in accordance with the second pattern; and adhering the first ceiling layer to the second ceiling layer in accordance with the adhesive agent via the one or more third holes of the membrane.

24. The method of claim 21, wherein the filtering fabric comprises an expanded polytetrafluoroethylene (ePTFE) material.

25. The method of claim 21, wherein the first ceiling layer, the second layer and the plurality of base portions are each formed from a metal material comprising one or more of stainless steel, plated brass, plated aluminum and nickel.

26. The method of claim 21, the method further comprising:

disposing at least one of a hydrophobic coating and an oleophobic coating on at least a portion of the filtering fabric.

27. The method of claim 21, wherein the membrane layer is configured to substantially block one or more of liquids and contaminants from passing into each of the plurality of housing packages.

* * * * *